United States Patent
Bedell et al.

(10) Patent No.: US 9,324,566 B1
(45) Date of Patent: Apr. 26, 2016

(54) CONTROLLED SPALLING USING A REACTIVE MATERIAL STACK

(71) Applicant: International Business Machines Corporation, Armonk, NY (US)

(72) Inventors: Stephen W. Bedell, Wappingers Falls, NY (US); Bahman Hekmatshoartabari, White Plains, NY (US); Jeehwan Kim, Los Angeles, CA (US); Ghavam G. Shahidi, Pound Ridge, NY (US); Davood Shahrjerdi, Brooklyn, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/587,972

(22) Filed: Dec. 31, 2014

(51) Int. Cl.
*B32B 38/10* (2006.01)
*H01L 21/304* (2006.01)
(Continued)

(52) U.S. Cl.
CPC ........ *H01L 21/304* (2013.01); *H01L 21/32051* (2013.01); *B32B 38/10* (2013.01); *B32B 43/006* (2013.01); *H01L 21/30* (2013.01);
(Continued)

(58) Field of Classification Search
CPC .... B32B 43/006; B32B 38/10; Y10T 156/11; Y10T 156/1153; Y10T 156/1168; Y10T 156/19; Y10T 156/1911; Y10T 156/1961; H01L 21/30; H01L 21/302; H01L 21/304; H01L 21/306; H01L 21/7806; H01L 21/7813

USPC ................. 156/701, 711, 714, 750, 752, 761
See application file for complete search history.

(56) References Cited

U.S. PATENT DOCUMENTS 3,839,727 A * 10/1974 Herdzik .................. H01L 24/10
  228/123.1
6,642,079 B1 * 11/2003 Liu .......................... H01L 24/11
  257/E21.508

(Continued)

FOREIGN PATENT DOCUMENTS

KR    0171377        7/1997
WO    WO2012067326 A1    5/2012
(Continued)

OTHER PUBLICATIONS

Thorton, J. A., et al., "Internal stresses in titanium, nickel, molybdenum, and tantalum films deposited by cylindrical magnetron sputtering", J. Vac. Sci. Technol., 14, Jan./Feb. 1977, p. 164.

(Continued)

*Primary Examiner* — Mark A Osele
*Assistant Examiner* — Nickolas Harm
(74) *Attorney, Agent, or Firm* — Scully, Scott, Murphy & Presser, P.C.; Louis J. Percello, Esq.

(57) ABSTRACT

A reactive material stack is formed above a surface of a base substrate. The reactive material stack includes metals which when subjected to heat energy or electrical energy can undergo a solid state reaction that provides an intermetallic compound. The intermetallic compound that forms has a smaller unit volume than the initial reactive material stack and, as such, induces a tensile stress within the base substrate which, in turn, initiates crack formation within the base substrate. This represents an initial stage of spalling. The crack formation can be propagated along a fracture plane within the base substrate by continued spalling.

19 Claims, 6 Drawing Sheets

(51) Int. Cl.
*H01L 21/3205* (2006.01)
*H01L 21/306* (2006.01)
*H01L 21/30* (2006.01)
*B32B 43/00* (2006.01)
*H01L 21/302* (2006.01)
*H01L 21/78* (2006.01)

(52) U.S. Cl.
CPC ............ *H01L 21/302* (2013.01); *H01L 21/306* (2013.01); *H01L 21/7806* (2013.01); *H01L 21/7813* (2013.01); *Y10T 156/11* (2015.01); *Y10T 156/1153* (2015.01); *Y10T 156/1168* (2015.01); *Y10T 156/19* (2015.01); *Y10T 156/1911* (2015.01); *Y10T 156/1961* (2015.01)

(56) References Cited

U.S. PATENT DOCUMENTS

| | | | |
|---|---|---|---|
| 7,364,616 | B2 | 4/2008 | Tsuchiya et al. |
| 2005/0067699 | A1* | 3/2005 | Leong ............... H01L 23/49816 257/737 |
| 2006/0113683 | A1* | 6/2006 | Dean ....................... C22C 11/00 257/783 |
| 2008/0283190 | A1 | 11/2008 | Papworth et al. |
| 2009/0001557 | A1* | 1/2009 | Renavikar ............... H01L 21/50 257/712 |
| 2010/0175756 | A1 | 7/2010 | Weihs et al. |
| 2010/0311250 | A1 | 12/2010 | Bedell et al. |
| 2010/0330788 | A1 | 12/2010 | Yu et al. |
| 2011/0272792 | A1* | 11/2011 | Gruenhagen ....... H01L 21/6835 257/666 |

FOREIGN PATENT DOCUMENTS

| | | |
|---|---|---|
| WO | WO2012081608 A1 | 6/2012 |
| WO | WO2012093574 A1 | 7/2012 |

OTHER PUBLICATIONS

Qiu, X., et al., "Reactive Multilayer Foils and Their Applications in Joining", A Thesis, Submitted to the Graduate Faculty of the Louisiana State University and Agricultural and Mechanical College in partial fulfillment of the requirements for the degree of Master of Science in Mechanical Engineering in The Department of Mechanical Engineering, Aug. 2007, 85 pages.

* cited by examiner

CONTROLLED SPALLING USING A REACTIVE MATERIAL STACK

BACKGROUND

The present application relates to semiconductor manufacturing. More particularly, the present application relates to a method of removing a material portion of a base substrate utilizing a spalling process in which a reactive material stack is used to control the removal process.

Devices such as, for example, photovoltaic and electro-optical, that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The recent development, see, for example, U.S. Patent Application Publication No. 2010/0311250 A1 to Bedell et al., of a novel layer transfer method referred to as 'controlled spalling technology' has permitted the fabrication of low-cost, thin-film, high quality substrates by removing a surface layer from a base substrate. The thin-film substrate layers that can be removed by this controlled spalling technology can be used to 1) increase the cost per Watt value of conventional photovoltaic technology or 2) permit fabrication of novel, high-efficiency photovoltaic, electronic and opto-electronic materials that are flexible and can be used to produce new products.

Control spalling of the type mentioned above relies on the intrinsic mechanical properties of a tensile stressor material for determining the fracture depth within the underlying bulk substrate. The use of such a process does not readily permit the ability to engineer the process in terms of fracture depth and/or residual stress. As such, there is a need to provide a material removal process which is capable of controlling fracture depth and/or residual stress as well as easing the requirements for the tensile stressor material in terms of level of stress and thickness.

SUMMARY

A reactive material stack is formed above a surface of a base substrate. The reactive material stack includes metals which when subjected to heat energy or electrical energy can undergo a solid state reaction that provides an intermetallic compound. The intermetallic compound that forms has a smaller unit volume than the initial reactive material stack and, as such, induces a tensile stress within the base substrate which, in turn, initiates crack formation within the base substrate. This represents an initial stage of spalling. The crack formation can be propagated along a fracture plane within the base substrate by continued spalling.

In one aspect of the present application, a method of removing a material portion of a base substrate is provided. In one embodiment of the present application, the method includes forming a reactive material stack comprising 2n metal layers above a surface of a base substrate, wherein n is from 1 to 1000. Next, an upper portion of the base substrate is removed by spalling to provide a spalled material portion. In accordance with the present application, spalling comprises initiating a solid state reaction of the 2n metal layers of the reactive material stack to provide an intermetallic compound layer of the 2n metal layers of the reactive material stack that induces a tensile stress within the base substrate and causes crack initiation within the base substrate.

DETAILED DESCRIPTION

The present application will now be described in greater detail by referring to the following discussion and drawings that accompany the present application. It is noted that the drawings of the present application are provided for illustrative purposes and, as such, they are not drawn to scale. In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

Spalling is a unique mode of brittle fracture whereby a tensile surface layer induces fracture parallel and below a film/substrate interface. The origin of this effect lies in the combination of normal stress (mode I) and shear stress (mode II). The use of spalling mode fracture for layer transfer has been previously demonstrated exploiting thermal effects, primarily taking advantage of the coefficient of thermal expansion (CTE) differences between a brittle substrate and a film to induce the necessary tensile stress to satisfy the spalling mode fracture and therefore create a fracture parallel to the film/substrate interface as a depth within the brittle substrate. However, the use of such a scheme results in little ability to engineer the process in terms of fracture depth and/or residual stress. In such spalling methods, the entire substrate is heated or cooled. Additionally, the use of local annealing using a laser has been contemplated.

The present application provides a controlled spalling process that circumvents the problems mentioned above in a typical spalling process. The process of the present application uses a reactive material stack in lieu of, or in conjunction with, a stressor layer. Notably, the reactive material stack is formed above a base substrate and then spalling is performed by first initiating a solid state reaction among the various materials that constitute the reactive material stack. This reaction forms an intermetallic compound layer that has less unit volume than the original reactive material stack. The intermetallic compound layer induces a tensile stress within the base substrate and thereafter crack formation begins. Crack propagation along a fracture plane within the base substrate occurs by continued spalling. The fracture plane that is provided with the base substrate is parallel to a first surface of the base substrate.

Figure 1:
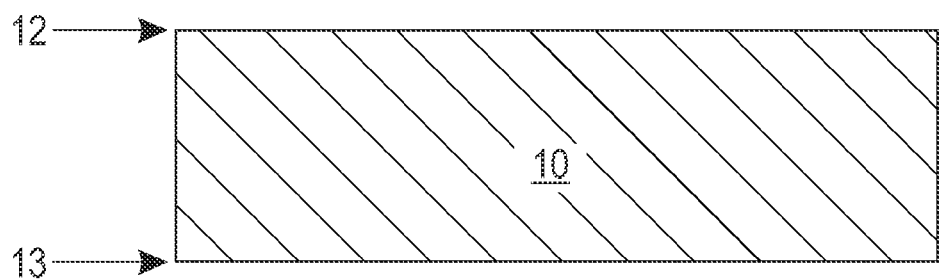
FIG. 1 is a cross sectional view of an exemplary structure including a base substrate that can be employed in one embodiment of the present application.

Referring first to FIG. 1, there is illustrated an exemplary structure including a base substrate 10 that can be employed in accordance with an embodiment of the present application. The base substrate 10 includes a first surface (i.e., topmost surface) 12 and a second surface (i.e., bottommost surface) 13 that is opposite the first surface 12.

The base substrate 10 that can be employed in the present application may comprise a semiconductor material, a glass, a ceramic or any another material or combination of materials whose fracture toughness is less than that of the stressor layer to be subsequently formed. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

When the base substrate 10 comprises a semiconductor material, the semiconductor material may include, but is not limited to, Si, Ge, SiGe, SiGeC, SiC, Ge alloys, compounds semiconductor such as, for example III-V compound semiconductors or II-VI compound semiconductor. In some embodiments, the base substrate 10 can be a III-V compound semiconductor such as, for example, GaSb, GaP, GaN, GaAs, InAs, InP, InAsP and AN. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators. In some embodiments, base substrate 10 comprises a multi-layered stack of semiconductor materials. An illustrated example of such a base substrate is a multilayered stack of from bottom to top, a layer of germanium, and a layer of gallium arsenide. When the base substrate 10 comprises a semiconductor material, the semiconductor material can be doped, undoped or contain doped regions and undoped regions.

In one embodiment, the semiconductor material that can be employed as the base substrate 10 can be single crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In yet another embodiment of the present application, the semiconductor material that can be employed as the base substrate 10 can be amorphous (i.e., a non-crystalline material that lacks the long-range order characteristic of a crystal). Typically, the semiconductor material that can be employed as the base substrate 10 is a single crystalline material.

When the base substrate 10 comprises a glass, the glass can be a $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic can be any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present application, one or more devices (not shown) including, but not limited to, transistors, capacitors, diodes, BiCMOS, resistors, etc. can be processed on and/or within the base substrate 10 utilizing techniques well known to those skilled in the art. An upper region (or portion) of the base substrate 10 which may include the one or more devices can be removed utilizing a mechanical layer transfer process known as spalling. In some embodiments of the present application, the upper region of the base substrate 10 may also include one or more III-V compound semiconductor layers which can be used as a photovoltaic device.

In some embodiments of the present application, the first surface 12 of the base substrate 10 can be cleaned prior to further processing to remove surface oxides and/or other contaminants therefrom. In one embodiment of the present application, the first surface 12 of the base substrate 10 is cleaned by applying to the first surface 12 of the base substrate 10 a solvent such as, for example, acetone and isopropanol, which is capable of removing contaminates and/or surface oxides from the first surface 12 of the base substrate 10.

In some embodiments of the present application, the first surface 12 of the base substrate 10 can be made hydrophobic by oxide removal prior to use by dipping the first surface 12 of the base substrate 10 into hydrofluoric acid. A hydrophobic, or non-oxide, surface provides improved adhesion between the cleaned surface and certain stressor layers to be deposited.

Figure 2:
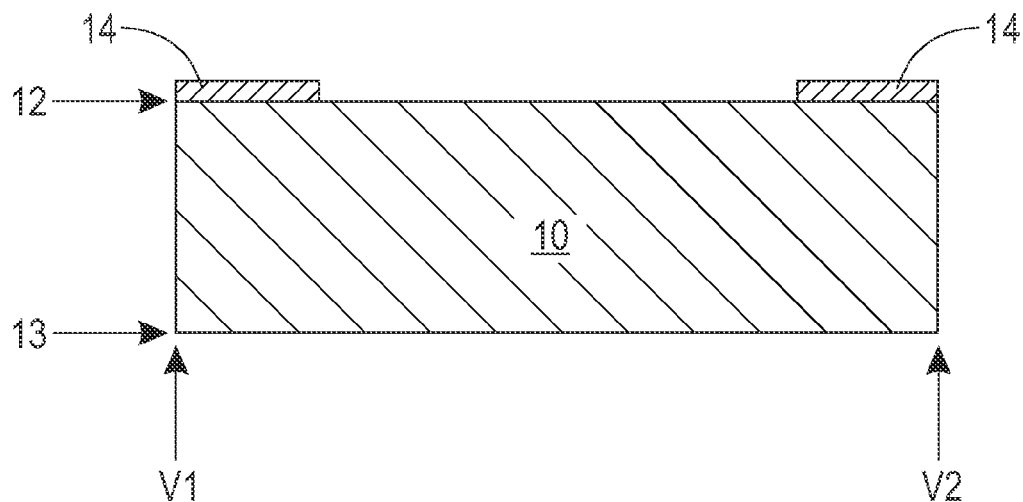
FIG. 2 is a cross sectional view of the exemplary structure of FIG. 1 after forming an edge exclusion material at the edges of the base substrate in accordance with another embodiment of the present application.
Figure 3:
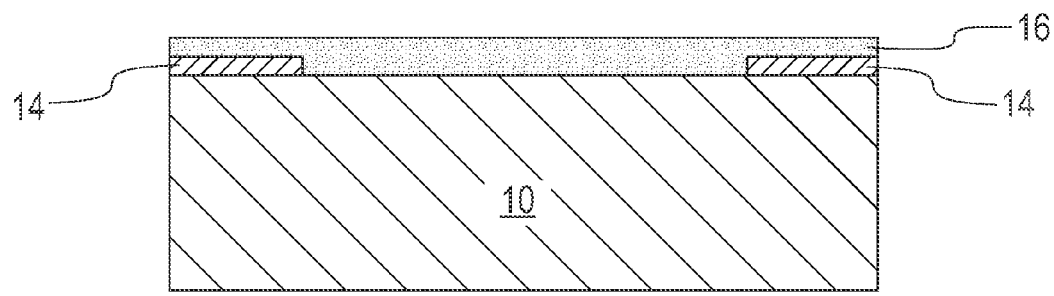
FIG. 3 is a cross sectional view of the exemplary structure of FIG. 2 after forming a metal-containing adhesion layer on exposed surfaces of the edge exclusion material and the base substrate in accordance with an embodiment of the present application.

Referring now to FIG. 2, there is illustrated the exemplary structure shown in FIG. 1 after forming an edge exclusion material 14 on the first surface 12 and at the vertical edges V1, V2 of the base substrate 10. In some embodiments of the present application, the edge exclusion material can be omitted and the process of the present application proceeds as shown in FIG. 3. In embodiments in which an edge exclusion material 14 is present, the edge exclusion material 14 has one edge that is vertically coincident with vertical edge V1,V2 of the base substrate 10, while another edge of the edge exclusion material 14 is located inward from edge V1,V2 and on the first surface 12 of the base substrate 10.

In one embodiment of the present application, the edge exclusion material 14 can be an adhesion demoter. By "adhesion demoter" it is meant any material that reduces the ability of a subsequently formed optional metal-containing adhesion layer, stressor layer or reactive material stack to adhere, i.e., stick, to the first surface 12 of the base substrate 10. The adhesion demoters that can be employed in the present application as the edge exclusion material 14 include, but are not limited to, photoresist materials, polymers, hydrocarbon materials, inks, powders, pastes or non-adherent metals. In one embodiment, the adhesion demoter that can be employed in the present application as the edge exclusion material 14 is an ink.

The photoresist materials that can be employed as the adhesion demoter include any well known positive-tone materials and/or negative-tone materials. The polymers that can be employed as the adhesion demoter include, but are not limited to, natural polymers such as rubbers, shellac, cellulose, synthetic polymers such as nylon, polyethylene and polypropylene, deposited or applied in the form of tape or film. The hydrocarbon materials that can be employed as the adhesion demoter include, but are not limited to, saturated hydrocarbons (i.e., alkanes), unsaturated hydrocarbons (i.e., alkenes or alkynes), cycloalkanes, and/or aromatic hydrocarbons (i.e., arenes). Inks that can be employed as the adhesion demoter include, but are not limited to, alcohol or water-based inks commonly found in commercial permanent markers or inks used in bubble-jet printing technology. Non-adherent metals that can be employed as the adhesion demoter include, but are not limited to, Au, Ag, solders or low-melting point alloys. Pastes that can be employed as the adhesion demoter include, but are not limited to, metal based pastes, partially-cured epoxies, vacuum grease or similar materials.

The adhesion demoters that can be employed in the present application as the edge exclusion material 14 can be formed onto the first surface 12 of the base substrate 10 near edges V1, V2 utilizing techniques that are well known in the art. For example, the adhesion demoters that can be employed in the present application as the edge exclusion material 14 can be formed by chemical vapor deposition, plasma enhanced chemical vapor deposition, atomic layer deposition, spin-coating, brushing, spray coating, screen-printing, bubble-jet printing, or fabric-tip application. In some embodiments in which inks are employed as the adhesion demoters, the ink can be applied from a pen or marker containing the same. In one embodiment, the edge exclusion material 14 has a width, which is determined from one sidewall edge to another sidewall edge, of from 0.01 mm to 10 mm. In another embodiment, the edge exclusion material 14 has a width of from 0.1 mm to 5 mm. It is observed that the portion of the base substrate 10 that is located directly beneath the edge exclusion material 14 defines an edge exclusion region whose presence minimizes edge related breakage during a subsequent spalling process. The term "edge exclusion region" is used throughout the present application to denote an area atop the base substrate 10 in which a subsequently formed stressor layer and/or reactive material stack (both of which will be subsequently formed) is either not present or if, present, the stressor layer and/or reactive material stack does not significantly adhere to the first surface 12 of the base substrate 10.

Referring now to FIG. 3, there is illustrated the exemplary structure of FIG. 2 after forming an optional metal-containing adhesion layer 16 on exposed surfaces of the edge exclusion material 14 and on exposed portions of the first surface 12 of the base substrate 10. In some embodiments, and when no edge exclusion material 14 is present, the optional metal-containing adhesion layer 16 can be formed directly on the entirety of the first surface 12 of base substrate 10.

The optional metal-containing adhesion layer 16 is employed in embodiments in which the stressor layer or the reactive material stack to be subsequently formed has poor adhesion to first surface 12 of the base substrate 10. In some embodiments, the metal-containing adhesion layer 16 is employed when a stressor layer comprised of a metal is employed. In other embodiments, an optional plating seed layer (not shown) can be formed directly atop the first surface 12 of the base substrate 10. The optional plating seed layer can be used together with the metal-containing adhesion layer 16 or in lieu thereof. When used together with the metal-containing adhesion layer 16, the plating seed layer is formed on an exposed surface of the metal-containing adhesion layer 16. When the optional plating seed layer is employed in conjunction with the edge exclusion material 14, the edge exclusion material 14 is applied to the first surface 12 of the base substrate 10 prior to deposition of the plating seed layer.

The optional metal-containing adhesion layer 16 that can be employed in the present application includes any metal adhesion material such as, but not limited to, Ti/W, Ti, Cr, Ni or any combination thereof. The optional metal-containing adhesion layer 16 may comprise a single layer or it may include a multilayered structure comprising at least two layers of different metal adhesion materials.

When present, the optional metal-containing adhesion layer 16 can be formed at a temperature from 15° C. to 40° C., i.e., 288K to 313K, or above. In one embodiment, the optional metal-containing adhesion layer 16 can be formed at a temperature which is from 20° C. (293K) to 180° C. (353K). In another embodiment, the optional metal-containing adhesion layer 16 can be formed at a temperature which is from 20° C. (293K) to 60° C. (333K).

The metal-containing adhesion layer 16, which may be optionally employed, can be formed utilizing deposition techniques that are well known to those skilled in the art. For example, the optional metal-containing adhesion layer 16 can be formed by sputtering, chemical vapor deposition, plasma enhanced chemical vapor deposition, chemical solution deposition, physical vapor deposition, or plating. When sputter deposition is employed, the sputter deposition process may further include an in-situ sputter clean process before the deposition.

When employed, the optional metal-containing adhesion layer 16 typically has a thickness from 5 nm to 300 nm, with a thickness from 100 nm to 150 nm being more typical. Other thicknesses for the optional metal-containing adhesion layer 16 that are below and/or above the aforementioned thickness ranges can also be employed in the present application.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Ti/Ni, Ti/Ag, Ti/Au, Cr/Ni, Cr/Ag, Cr/Au, Al(bottom)/Ti/Ni (top), etc. The thickness of the optional plating seed layer may vary depending on the material or materials of the optional plating seed layer as well as the technique used in forming the same. Typically, the optional plating seed layer has a thickness from 2 nm to 1 micron. The optional plating seed layer can be formed by a conventional deposition process including, for example, chemical vapor deposition (CVD), plasma-enhanced chemical vapor deposition (PECVD), atomic layer deposition (ALD), or physical vapor deposition (PVD) techniques that may include evaporation and/or sputtering.

In accordance with the present application, the optional metal-containing adhesion layer 16 and/or the optional plating seed layer is (are) formed at a temperature which does not effectuate spontaneous spalling to occur within the base substrate 10.

Figure 4:
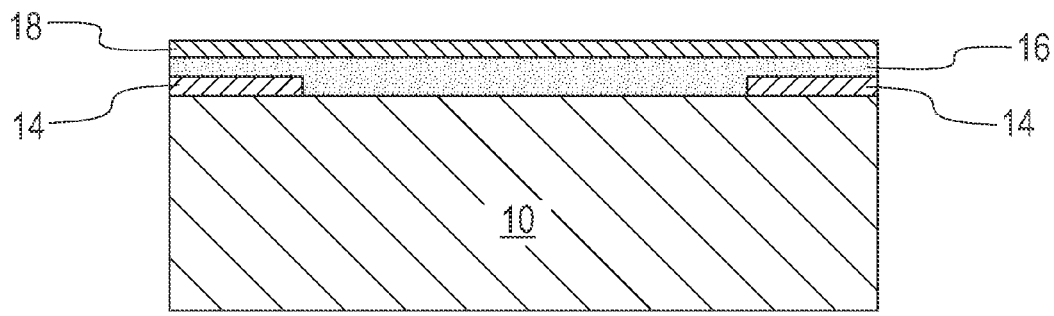
FIG. 4 is a cross sectional view of the exemplary structure of FIG. 3 after forming a stressor layer on a surface of the metal-containing adhesion layer in accordance with an embodiment of the present application.

Referring now to FIG. 4, there is illustrated the exemplary structure of FIG. 3 after forming a stressor layer 18 on an upper surface of the optional metal-containing adhesion layer 16. In some embodiments in which the optional metal-containing adhesion layer 16 is not present, the stressor layer 18 can be formed directly on the first surface 12 of base substrate 10; this particular embodiment is not shown in the drawings, but can readily be deduced from the drawings illustrated in the present application. In other embodiments in which an optional plating seed layer is employed, the stressor layer 18 can be formed directly on the upper surface of the optional plating seed layer; this particular embodiment is also not shown in the drawings, but can readily be deduced from the drawings illustrated in the present application. In yet further embodiments of the present application, the stressor layer 18 can be omitted. In such an embodiment, the reactive material stack (to be subsequently formed) is used as the sole stressor material in the spalling process of the present application.

The stressor layer 18 that can be employed in the present application includes any material that is under tensile stress on base substrate 10 after deposition. The stressor layer 18 can also be referred to a stress inducing layer. In accordance with the present application, the stressor layer 18 has a critical thickness and a stress value that cause spalling mode fracture to occur within the base substrate 10. In particular, the stressor layer 18 has a critical thickness in which spalling is initiated below the first surface 12 of base substrate 10 and somewhere within the base substrate 10. By 'critical', it is meant that for a given stressor material and base substrate material combination, a thickness value and a stressor value for the stressor layer is chosen that render spalling mode fracture possible (can produce a $K_I$ value greater than the $K_{IC}$ of the substrate). The stress value can be adjusted by tuning the deposition conditions of the stressor layer 18. For example, in the case of sputter deposition of stressor layer 18, the gas pressure can be used to tune the stress value as described in Thorton and Hoffman, *J. Vac. Sci. Technol.*, 14 (1977) p. 164.

The thickness of the stressor layer 18 is chosen to provide the desired fracture depth somewhere within the base substrate 10. For example, if the stressor layer 18 is chosen to be Ni, then fracture will occur at a depth below the stressor layer 18 roughly 2 to 3 times the Ni thickness. The stress value for the stressor layer 18 is then chosen to satisfy the critical condition for spalling mode fracture. This can be estimated by inverting the empirical equation given by $t^*=[(2.5\times10^6)(K_{IC}^{3/2})]/\sigma^2$, where $t^*$ is the critical stressor layer thickness (in microns), $K_{IC}$ is the fracture toughness (in units of MPa·m$^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied atop the base substrate 10 and thus can be employed as the stressor layer 18 include, but are not limited to, a metal, a polymer, such as a spall inducing tape layer, or any combination thereof. The stressor layer 18 may comprise a single stressor layer, or a multilayered stressor structure including at least two layers of different stressor material can be employed.

In one embodiment, the stressor layer 18 is a metal, and the metal is formed on an upper surface of the optional metal-containing adhesion layer 16. In another embodiment, the stressor layer 18 is a spall inducing tape, and the spall inducing tape is applied directly to the first surface 12 of the base substrate 10. In another embodiment, for example, the stressor layer 18 may comprise a two-part stressor layer including a lower part and an upper part. The upper part of the two-part stressor layer can be comprised of a spall inducing tape layer.

When a metal is employed as the stressor layer 18, the metal can include, for example, Ni, Cr, Fe, Mo, Ti or W. Alloys of these metals can also be employed. In one embodiment, the stressor layer 18 includes at least one layer consisting of Ni.

When a polymer is employed as the stressor layer 18, the polymer is a large macromolecule composed of repeating structural units. These subunits are typically connected by covalent chemical bonds. Illustrative examples of polymers that can be employed as the stressor layer 18 include, but are not limited to, polyimides polyesters, polyolefins, polyacrylates, polyurethane, polyvinyl acetate, or polyvinyl chloride.

When a spall inducing non-metallic layer (i.e. polymeric materials such as a tape) is employed as the stressor layer 18, the spall inducing layer includes any pressure sensitive tape that is flexible, soft, and stress free at a first temperature used to form the tape, yet strong, ductile and tensile at a second temperature used during removal, i.e., spalling of an upper portion of the base substrate 10. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 10 (with a lower thermal coefficient of expansion) and the tape (with a higher thermal expansion coefficient).

Typically, the pressure sensitive tape that is employed in the present application as stressor layer 18 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 18 employed in the present application is formed at room temperature (15° C.-40° C., i.e., 288K-313K). In another embodiment, when a tape layer is employed, the tape layer can be formed at a temperature from 15° C. (288K) to 60° C. (333K).

When the stressor layer 18 is a metal or polymer, the stressor layer 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, or plating.

When the stressor layer 18 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present application as stressor layer 18 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the first surface 12 of base substrate 10, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 18 is of a metallic nature, it typically has a thickness of from 1 µm to 50 µm, with a thickness of from 4 µm to 7 µm being more typical. Other thicknesses for the stressor layer 18 that are below and/or above the aforementioned thickness ranges can also be employed in the present application.

If the stressor layer 18 is of a polymeric nature, it typically has a thickness of from 10 µm to 200 µm, with a thickness of from 50 µm to 100 µm being more typical. Other thicknesses for the stressor layer 18 that are below and/or above the aforementioned thickness ranges can also be employed in the present application.

Figure 5:
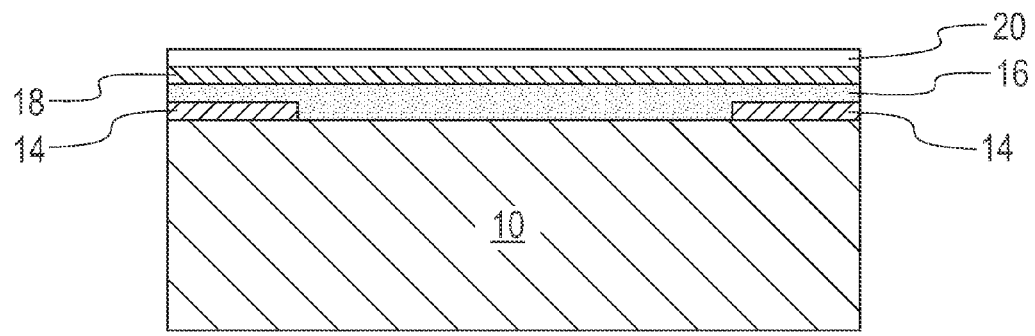
FIG. 5 is a cross sectional view of the exemplary structure of FIG. 4 after forming a dielectric material on a surface of the stressor layer in accordance with an embodiment of the present application.

Referring now to FIG. 5, there is illustrated the exemplary structure of FIG. 4 after forming an optional dielectric layer 20 on the stressor layer 18. Although the illustrated embodiment shows the dielectric layer 20 formed interposed between the stressor layer 18 and the reactive material stack (to be subsequently formed), the dielectric layer 20 can be formed anywhere between the reactive material stack (to be subsequently formed) and the base substrate 10. In some embodiments of the present application, the dielectric layer 20 can be omitted. In one embodiment of the present application, the dielectric layer 20 may comprise a single dielectric material. In another embodiment of the present application, the dielectric layer 20 may comprise a multilayered stack of dielectric materials. The dielectric material(s) that can provide the dielectric layer 20 may comprise any insulating material such as, for example, silicon dioxide, silicon nitride, silicon oxynitride, a dielectric metal oxide (such as, for example, $Al_2O_3$ or $TiO_2$) or multilayered combinations thereof. The dielectric layer 20 of the present application can help to control/adjust temperature of the structure during the spalling process.

The dielectric layer 20 can have a thickness from 1 µm to 100 µm, with a thickness of from 1 µm to 50 µm being more typical. Other thicknesses for the dielectric layer 20 that are below and/or above the aforementioned thickness ranges can also be employed in the present application. The dielectric layer 20 can be formed utilizing a deposition process including, for example, chemical vapor deposition, chemical vapor deposition, physical vapor deposition or sputtering.

Figure 6:
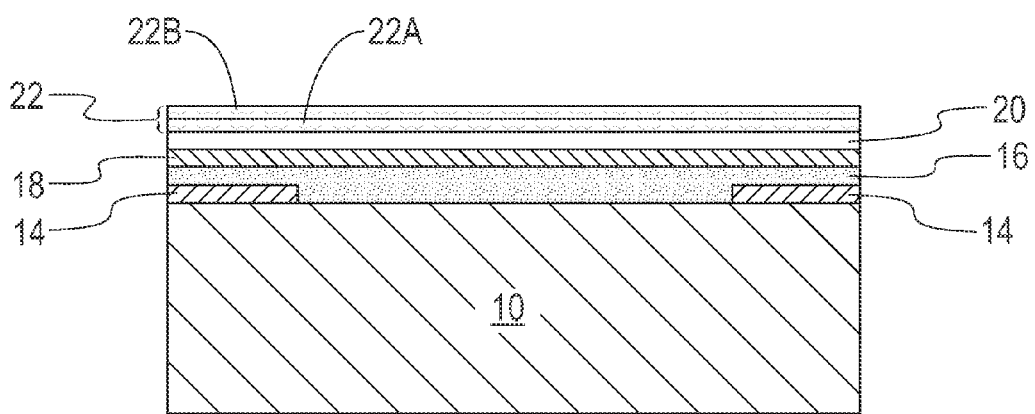
FIG. 6 is a cross sectional view of the exemplary structure of FIG. 5 after forming a reactive material stack on a surface of the dielectric layer in accordance with an embodiment of the present application.

Referring now to FIG. 6, there is illustrated the exemplary structure of FIG. 5 after forming a reactive material stack 22 on a surface of the dielectric layer 20. In some embodiments and when the dielectric layer 20 is not employed, the reactive material stack 22 can be formed on a surface of stressor layer 18. In such an embodiment, the stressor layer 18 may be used entirely as, or in part as, a lower portion of the reactive material stack 22. In other embodiments, and when the dielectric layer 20 and the stressor layer 18 are both not employed, the reactive material stack 22 can be formed on a surface of the plating seed layer, or the metal-containing adhesion layer 16. In yet further embodiments and when the dielectric layer 20, the stressor layer 18 and the metal-containing adhesion layer 16 are not employed, the reactive material stack 22 can be formed on a surface of the edge exclusion material 12 and a surface of the base substrate 10. In yet an even further embodiment of the present application, and when the dielectric layer 20, stressor layer 18, metal-containing adhesion layer 16 are not employed, the reactive material stack 20 can be formed on a surface of the base substrate 10. In any of the previous embodiments of the present application, dielectric layer 20 can be formed interposed between the reactive material stack 20 and the base substrate 10.

By "reactive material stack" it is meant any combination of 2n metal layers stacked one atop the other, wherein n is from 1 to 1000 which when subjected to an external energy source or electrical source, a solid state reaction can be initiated between the 2n metal layers of the reactive material stack to provide an intermetallic compound of the 2n metal layers. Thus, and in accordance with the present application, the formation of the intermetallic compound by the solid state chemical reaction between the 2n metallic layers must have a non-zero positive change in Gibbs free energy to proceed.

In some embodiments of the present application (and as shown), the reactive material stack 22 includes a first metal layer 22A and a second metal layer 22B. In other embodiments of the present application (not shown), the reactive material stack 22 may include four metal layers stacked one atop the other.

In one embodiment of the present application, the reactive material stack 22 includes a first metal layer 22A of Ni, and a second metal layer 22B of Al. In yet another embodiment of the present application, the reactive material stack 22 includes a first metal layer 22A of Ti and a second metal layer 22B of Al. In yet another embodiment of the present application, the reactive material stack 22 includes a first metal layer 22A of Ni and a second metal layer 22B of Si. In some embodiments any combination of the above metal layers, i.e., Ni/Al/Ti/Al, Ni/Al/Ti/Al/Ni/Si, Ni/Si/Ni/Al, Ni/Al/Pt/Al or Ni/Al/Ni/Si, can be used. Other metallic bilayers that are known to result in self-propagating solid state reactions include Ti/B, Ni/Si, Zr/Si, Rh/Si, Ni/Al, Monel (7Ni:3Cu)/Al, Ti/Al, Pd/Al, Pt/Al, and $CuO_x$/Al multilayer materials can also be employed in the present application as the reactive material stack 22.

The reactive metal stack 22 can be formed utilizing any deposition process including, for example, sputtering, chemical vapor deposition, plasma enhanced chemical vapor deposition, chemical solution deposition, physical vapor deposition, plating or any combination thereof. In some embodiments of the present application, and as shown, the reactive material stack 22 is a contiguous layer that is formed above the entire length of the base substrate 10. In yet another embodiment of the present application, the reactive material stack 22 may be patterned (by, for example, lithography and etching) to form at least one reactive material stack portion located above different portions of the base substrate 10.

The reactive material stack 22 can have a thickness from 100 nm to 10000 nm. Other thicknesses that are lesser than or greater than the aforementioned thickness range can also be employed as the thickness of the reactive material stack 22.

The thickness of first metal layer 22A may be different than that of second metal layer 22B in order to optimize the energy release during the reaction, or to control the stoichiometry of the final intermetallic compound. For example and when the first metal layer 22A is Ti and the second metal layer 22B is Al, the thickness values are typically 20 nm for the first metal 22A (Ti) and 50 nm for the second metal layer 22B (Al). In general, the thickness of the individual metal layers 22A and 22B range from 1 nm to 1000 nm, with 2 nm to 100 nm being more typical.

Figure 7:
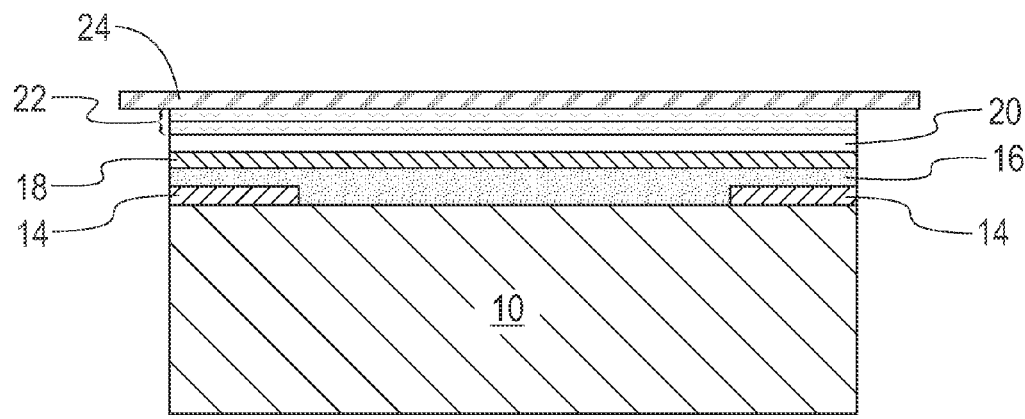
FIG. 7 is a cross sectional view of the exemplary structure of FIG. 6 after forming a handle substrate on a topmost surface of the reactive material stack in accordance with an embodiment of the present application.

Referring now to FIG. 7, there is illustrated the exemplary structure of FIG. 6 forming a handle substrate 24 atop the reactive material stack 22. In some embodiments of the present application, the handle substrate 24 can be omitted. The material that provides the handle substrate 24 of the present application can include any flexible material which has a minimum radius of curvature of less than 30 cm. Illustrative examples of flexible materials that can be employed as the handle substrate 24 include a metal foil, a polyimide foil or a tape.

The handle substrate 24 can be used to provide better fracture control and more versatility in handling the spalled portion of the base substrate 10. Moreover, the handle substrate 24 can be used to guide the crack propagation during the spalling process of the present application. The handle substrate 24 of the present application is typically, but not necessarily, formed at a first temperature which is at room temperature (15° C. (288K)-40° C. (313K)).

The handle substrate 24 can be formed utilizing deposition techniques that are well known to those skilled in the art including, for example, mechanical pressure, dip coating, spin-coating, brush coating, sputtering, chemical vapor deposition, plasma enhanced chemical vapor deposition, chemical solution deposition, physical vapor deposition, or plating.

The handle substrate 24 typical has a thickness of from 5 µm to 500 µm, with a thickness of from 10 µm to 150 µm being more typical. Other thicknesses for the handle substrate 24 that are below and/or above the aforementioned thickness ranges can also be employed in the present application.

As shown, the handle substrate 24 typically has a length that extends beyond the length of the base substrate 10. As such, it is possible to process multiple base substrates utilizing a single handle substrate 24.

Figure 8:
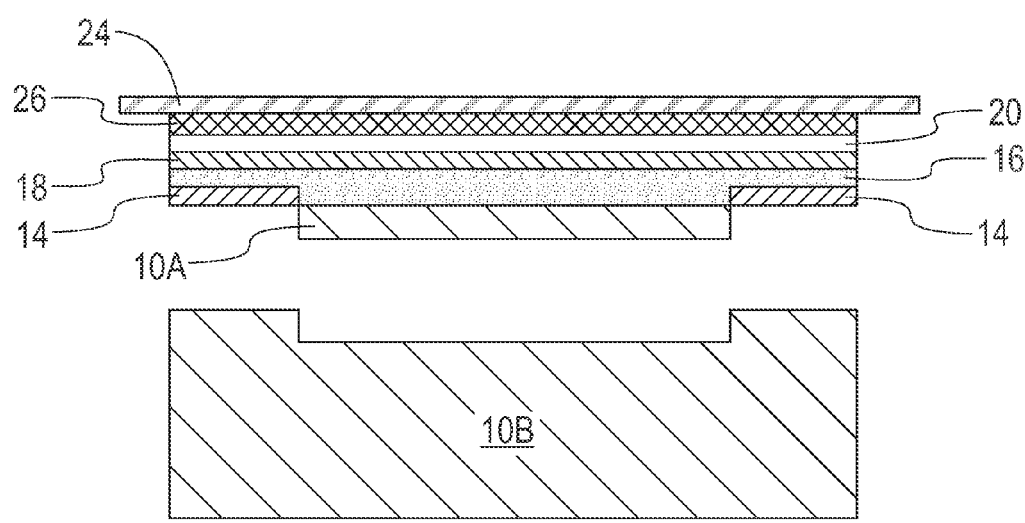
FIG. 8 is a cross sectional view of the exemplary structure of FIG. 7 after performing a spalling process in accordance with an embodiment of the present application.

Referring now to FIG. 8, there is illustrated the exemplary structure of FIG. 7 after removing an upper portion of the base substrate 10 by spalling. In accordance on the present application, spalling is initiated by subjecting the reactive material stack 22 to an external heat source or electrical source which initiates a solid state reaction between the 2n metal layers of the reactive material stack 22 and provides an intermetallic compound layer 26. The intermetallic compound layer 26 includes a solid state reaction product of the 2n metal layers. In one embodiment, the intermetallic compound layer 26 includes a Ni—Al alloy. In yet another embodiment, the intermetallic compound layer 26 includes a Ti—Al alloy. In yet a further embodiment, the intermetallic compound layer 26 includes a Ni—Si alloy. In even further embodiments, the intermetallic compound layer 26 includes a ternary or quarternary alloy such as, for example, Ni—Ti—Al, or Ni—Ti—Al—Si. During the solid state reaction, the 2n layers of the reactive material stack 22 are interdiffussed and intermixed forming the intermetallic compound layer 26. In some embodiments, and when the stressor layer 18 is used as the bottommost layer of the reactive material stack 22, the stressor layer becomes part of the intermetallic compound layer 26. During the solid state reaction heat is emitted which can aid in the spalling process of the present application.

The intermetallic compound layer 26 that is formed is more stable than the 2n metal layers that constituent the reactive material stack 22. Moreover, the intermetallic compound layer 26 that forms has a smaller unit volume than the 2n metal layers that constituent the reactive material stack 22. This smaller unit volume of the intermetallic compound layer 26 induces tensile stress and subsequent crack formation in the base substrate 10.

In one embodiment of the present application, the spalling process also includes pulling or peeling the handle substrate 24 to remove a spalled structure that includes at least the intermetallic layer 26 and an upper portion of the base substrate 10. The upper portion of the base substrate 10 that is removed by spalling from the original base substrate 10 may be referred herein as a spalled material portion 10A. The remaining portion of the original base substrate 10 may be referred to herein as remaining base substrate portion 10B.

As mentioned above, the spalling process includes crack formation within the base substrate 10 that is initiated by first inducing the solid state reaction mentioned above. In one embodiment, the formation of the intermetallic compound layer 26 is initiated by applying heat energy from an external heat source to the structure including the reactive material stack 22. In one embodiment of the present application, the external heat source can heat the structure including the reactive material stack 22 to a temperature from 200° C. to 500° C. Other temperatures that are lesser than or greater than the aforementioned temperature range can be used as long as the selected temperatures initiates the solid state reaction and formation of the intermetallic compound layer 26.

In another embodiment, the formation of the intermetallic compound layer 26 is initiated by applying electrical energy from an external energy source to the structure including the reactive material stack 22. In one embodiment of the present application, the electrical energy source can be a battery in which at least one of the electrodes of the battery is in direct contact with the more reactive metal layer of the reactive material stack 22. The direct contact can be at a sidewall edge or another surface of the more reactive metal layer of the reactive material stack 22. Lithography and etching can be used to define an opening within the structure for electrode contact. In one example, the battery can supply from 2 volts to 200 volts to the structure including the reactive material stack 22. Other voltages that are lesser than or greater than the aforementioned voltage range can be used as long as the selected voltage can initiate the solid state reaction and formation of the intermetallic compound layer 26.

After formation of the intermetallic compound layer 26, crack propagation within the base substrate 10 along a fracture plane that is located beneath surface 12 of the base substrate 10 that is induced by the formation of the intermetallic compound layer 26, can be performed by continued spalling. In some embodiments, the continued spalling can be performed at substantially room temperature (i.e., 15° C. to 40° C.). In other embodiments, the continued spalling can be performed at a temperature from 100° C. and below. In some embodiments of the present application, spalling can be continued by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

After spalling, a structure as shown in FIG. 8 is provided that includes at least the intermetallic compound layer 26 and the spalled material portion 10A In some embodiments, the structure after spalling may also include the handle substrate 24, the dielectric layer 20, the stressor layer 18, the plating seed layer, the metal-containing adhesion layer 16, the edge exclusion material 14 or any combination thereof. In one embodiment of the present application, the thickness of the spalled material portion 10A that is removed from the base substrate 10 has a thickness of less than 100 microns. In another embodiment, the spalled material portion 10A that is removed from the base substrate 10 has a thickness of less than 50 microns. Other thicknesses that are lesser than or greater than the aforementioned thickness range can also be obtained depending on the type of stressor layer and/or reactive material stack employed in the present application.

Figure 9:
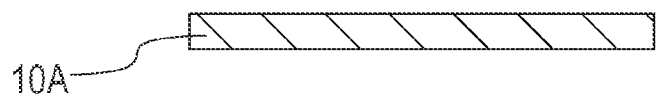
FIG. 9 is a cross sectional view of the exemplary structure of FIG. 8 after removing the various materials located on a spalled material portion of the base substrate.

Referring now to FIG. 9, there is illustrated the exemplary structure of FIG. 8 after removing the various materials (24, 26, 20, 18, 16 and 14) located on the spalled material portion 10A of the base substrate 10A. In some embodiments of the present application, this step may be performed after bonding the spalled material portion 10A to a substrate. In yet other embodiments, this step may be entirely omitted, and the resultant structure may include the intermetallic compound layer 26 and, if present, any of the handle substrate 24, the dielectric layer 20, the stressor layer 18, the metal-containing adhesion layer 16, the plating seed layer, and the edge exclusion material 14. Although the drawing illustrates the removal of all the materials (24, 26, 20, 18, 16 and 14) from the spalled material portion 10A of the base substrate 10, it is possible to maintain at least some of the aforementioned materials on the spalled material portion 10A.

The various materials (i.e., the intermetallic compound layer 26 and, if present, any of the handle substrate 24, the dielectric layer 20, the stressor layer 18, the plating seed layer, the metal-containing adhesion layer 16, and the edge exclusion material 14) can be removed utilizing conventional techniques well known to those skilled in the art. For example, and in one embodiment, aqua regia ($HNO_3/HCl$) can be used for removing the handle substrate 24, the intermetallic compound layer 26, the stressor layer 28, the plating seed layer, and the metal-containing adhesion layer 16. In another example, UV or heat treatment is used to remove the handle substrate 24 followed by a chemical etch to remove the intermetallic compound layer 26 and, if present, the stressor layer 18, followed by a different chemical etch to remove the plating seed layer, and/or the metal-containing adhesion layer 16. The edge exclusion material 14 can be removed utilizing an organic solvent such, for example, as acetone.

Figure 10:
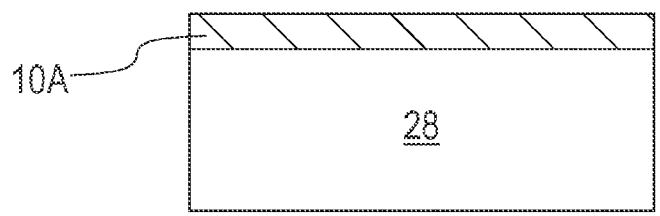
FIG. 10 is a cross sectional view of the exemplary structure of FIG. 9 after bonding the spalled material portion to a substrate in accordance with an embodiment of the present application.

Referring now to FIG. 10, there is illustrated the exemplary structure of FIG. 9 after bonding the spalled material portion 10A to a substrate 28 in accordance with an embodiment of the present application. Any bonding process well known to those skilled in the art can be used to provide the structure shown in FIG. 10. In one example, the bonding process may be performed at 20° to 250° C., with or without the application of an external force. The substrate 28 may be flexible, or non-flexible. In some embodiments, the substrate 28 may be comprised of a semiconductor material. In other embodiments, the substrate 28 may be comprised of a dielectric material.

Figure 11:
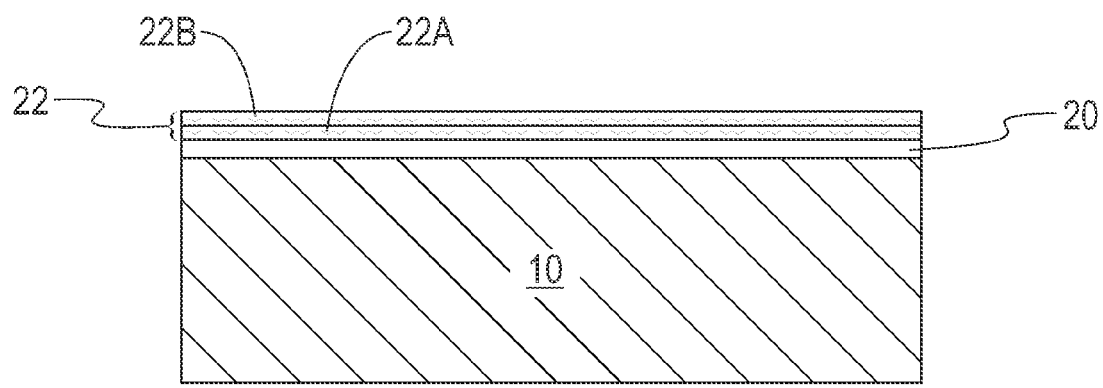
FIG. 11 is a cross sectional view of the exemplary structure of FIG. 1 after forming a dielectric layer on a surface of the base substrate and forming a reactive material stack on a surface of the dielectric layer in accordance with an embodiment of the present application.

Referring now to FIG. 11, there is illustrated the exemplary structure of FIG. 1 after forming a dielectric layer 20 on a surface of the base substrate 10 and forming a reactive material stack 22 on a surface of the dielectric layer 20. The materials and techniques mentioned above for the base substrate 10, the dielectric layer 20 and the reactive material stack 22 are the same as that described above. The structure shown in FIG. 11 can be then be spalled as described above, without or without the presence of a handle substrate. Other configurations are also possible provided that the configuration includes at least a reactive material stack 22 above a base substrate 10.

Figure 12:
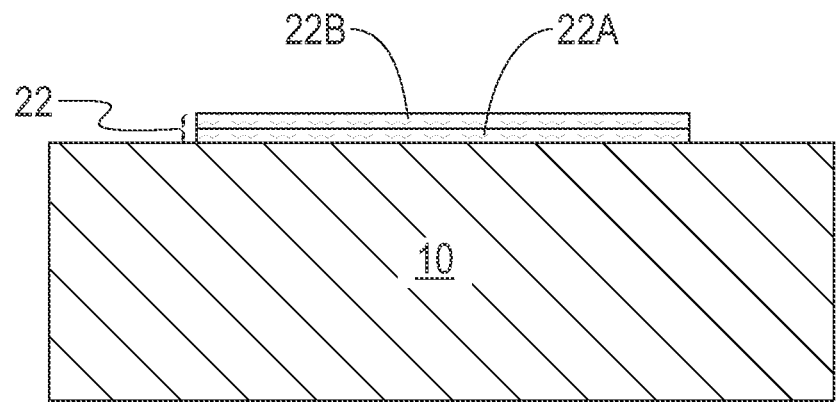
FIG. 12 is a cross sectional view of the exemplary structure of FIG. 1 after forming a reactive material stack on a surface of a base substrate and patterning the reactive material stack to provide a patterned reactive material stack portion.
Figure 13:
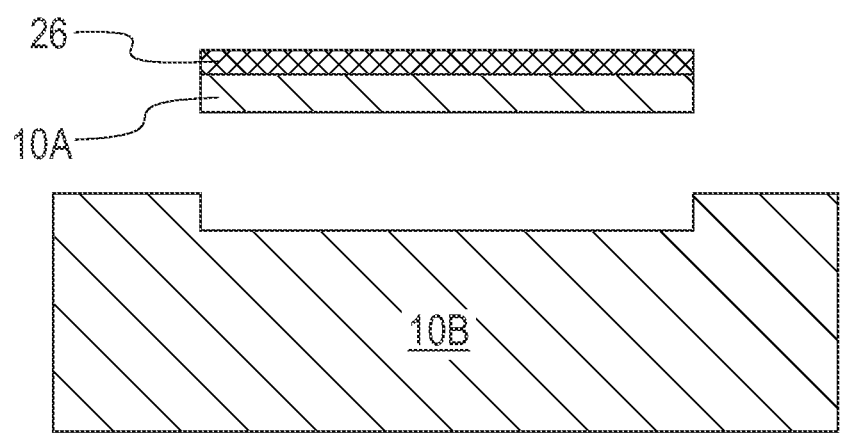
FIG. 13 is a cross sectional view of the exemplary structure of FIG. 12 after spalling.

Referring now to FIGS. 12-13, there are illustrated an embodiment of the present application in which a reactive material stack 22 is first formed on the surface of base substrate 10, and then patterned to provide a patterned reactive material stack portion 22P. The materials and techniques mentioned above for the base substrate 10 and the reactive material stack 22 are the same as that described above. Patterning can be achieved by lithography and etching. The structure that is formed after patterning is shown in FIG. 12. FIG. 13 illustrates the structure of FIG. 12 after spalling. Spalling is performed as described above, with or without the presence of a handle substrate. Other configurations are also possible provided that the configuration includes at least a reactive material stack 22 above a base substrate 10.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A method for removing a material portion of a base substrate, said method comprising:
   forming a reactive material stack comprising 2n metal layers above a surface of a base substrate, wherein n is from 1 to 1000; and
   removing an upper portion of said base substrate by spalling to provide a spalled material portion, wherein said spalling comprises initiating a solid state reaction of said 2n metal layers of said reactive material stack to provide an intermetallic compound layer of said 2n metal layers of said reactive material stack that induces a tensile stress within said base substrate and causes crack initiation within said base substrate.

2. The method of claim 1, further comprising forming an edge exclusion material on said surface and at each vertical edge of said base substrate prior to forming said reactive material stack.

3. The method of claim 2, wherein said edge exclusion material comprises a photoresist material, a polymer, a hydrocarbon material, an ink, a metal, or a paste.

4. The method of claim 1, further comprising forming a stressor layer above said surface of said base substrate prior to forming said reactive material stack.

5. The method of claim 4, wherein said stressor layer comprises a metal, a polymer, a spalling inducing tape or any combination thereof.

6. The method of claim 1, further comprises forming a dielectric layer disposed between said base substrate and said reactive material stack.

7. The method of claim 1, further comprising forming a handle substrate on an exposed surface of said reactive material stack prior to spalling.

8. The method of claim 7, wherein said spalling further comprises pulling or peeling said handle substrate.

9. The method of claim 1, wherein said initiating said solid state reaction of said 2n metal layers of said reactive material stack to provide said intermetallic compound layer comprises applying heat energy from an external heat source to said reactive material stack.

10. The method of claim 1, wherein said initiating said solid state reaction of said 2n metal layers of said reactive material stack to provide said intermetallic compound layer comprises applying electrical energy from an external electrical energy source to said reactive material stack.

11. The method of claim 1, wherein said spalling further comprises crack propagation though said base substrate, said crack propagation is performed at room temperature.

12. The method of claim 1, further comprising removing said intermetallic compound layer from said spalled material portion.

13. The method of claim 1, further comprising patterning said reactive material stack to provide at least one reactive material stack above said surface of said base substrate prior to spalling.

14. The method of claim 1, wherein said reactive material stack comprises Ni/Al, Ti/Al, Ni/Si or any multilayered stack thereof.

15. The method of claim 1, wherein a lower portion of said reactive material stack constituents in part, or entirely, of a metal stressor layer.

16. The method of claim 1, further comprising bonding an exposed surface of said spalled material portion of said base substrate to a substrate.

17. The method of claim 16, wherein a material removal process is performed either before bonding or after bonding to expose another surface of spalled material portion of said base substrate.

18. The method of claim 1, wherein said intermetallic compound layer has a smaller unit volume as compared to the unit volume of said reactive material stack.

19. The method of claim 1, wherein said intermetallic compound layer comprises a Ni—Al alloy, a Ti—Al alloy, a Ni—Si alloy, a Ni—Ti—Al alloy, a Ni—Ti—Al—Si alloy, a Ni—Al—Si alloy or a Ni—Ti—Si alloy.

* * * * *